(12) United States Patent
Yu et al.

(10) Patent No.: US 6,798,327 B2
(45) Date of Patent: Sep. 28, 2004

(54) INTEGRATED CIRCUIT TRANSFORMER

(75) Inventors: Jay Yu, Taipei Hsien (TW); Felix Kao, Taipei Hsien (TW)

(73) Assignee: VIA Technologies Inc., Taipei Hsien (TW)

(*) Notice: Subject to any disclaimer, the term of this patent is extended or adjusted under 35 U.S.C. 154(b) by 0 days.

(21) Appl. No.: 10/249,222

(22) Filed: Mar. 24, 2003

(65) Prior Publication Data

US 2004/0080392 A1 Apr. 29, 2004

(30) Foreign Application Priority Data

Oct. 25, 2002 (TW) ........................................ 91125303 A (51) Int. Cl.[7] .............................................. H01F 5/00
(52) U.S. Cl. ...................... 336/200; 336/223; 336/232
(58) Field of Search ................................ 336/200, 223, 336/232

(56) References Cited

U.S. PATENT DOCUMENTS

2002/0097129 A1 * 7/2002 Johnson ...................... 336/200
2003/0030532 A1 * 2/2003 Iida ............................. 336/200
2003/0085788 A1 * 5/2003 Yue .............................. 336/200
2003/0146816 A1 * 8/2003 Furumiya et al. ........... 336/200

* cited by examiner

Primary Examiner—Anh Mai
(74) Attorney, Agent, or Firm—Winston Hsu (57) ABSTRACT

An integrated circuit transformer includes a first conductive segment, a second conductive segment, a fifth conductive segment, and a sixth conductive segment, all disposed inside a first insulating layer. The first conductive segment, the second conductive segment, the fifth conductive segment, and the sixth conductive segment are respectively symmetric to a first line. The transformer further includes a third conductive segment and a fourth conductive segment, both formed inside a second insulating layer. The third conductive segment and the fourth conductive segment are symmetric to a second line. The transformer further includes a fist connection conductive segment connecting the fifth conductive segment to the second conductive segment, and a second connection conductive segment connecting the sixth conductive segment to the first conductive segment.

9 Claims, 14 Drawing Sheets

INTEGRATED CIRCUIT TRANSFORMER

BACKGROUND OF THE INVENTION

1. Field of the Invention

The present invention relates to an integrated circuit transformer, and more particularly, to an integrated circuit transformer having two symmetrical conductive coils respectively disposed inside two insulating layers.

2. Description of the Prior Art

Owing to the dramatic development of semiconductors and the growing demand for wireless communications chips, conventional passive components such as transformers are usually integrated into a chip to meet the requirements of small size and low cost for a modern wireless communications chip.

In wireless communications integrated circuits, an integrated circuit transformer is capable of changing impedances for signal ends. To effectively reduce common mode interference, increasingly wireless communications integrated circuits adopt a differential approach to transform single-ended unbalanced signals into differential-ended balanced signals and vise versa. For example, a balance-to-unbalance (BALUN) transformer can transform single-ended unbalanced signals into differential-ended balanced signals.

Figure 1A:
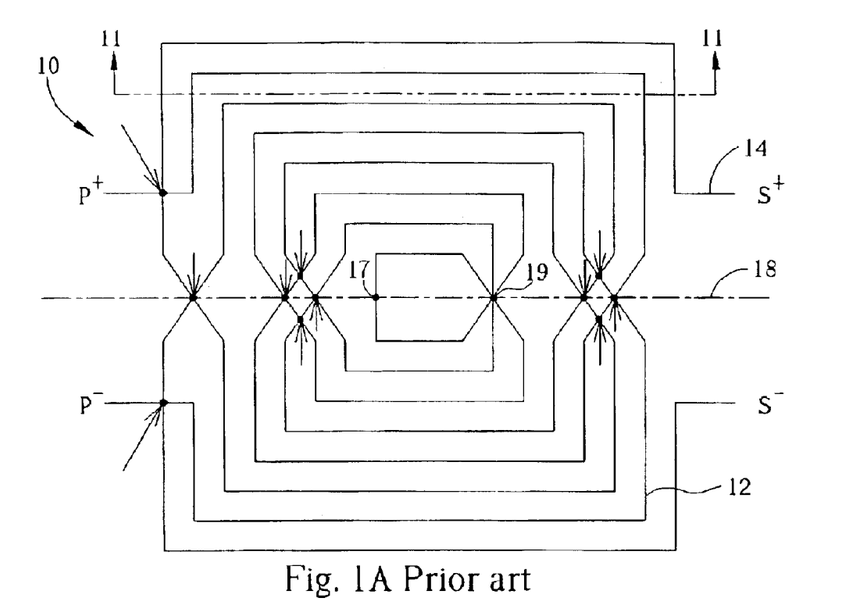
FIG. 1A is a schematic diagram of a BALUN integrated circuit transformer according to the prior art.
Figure 1B:
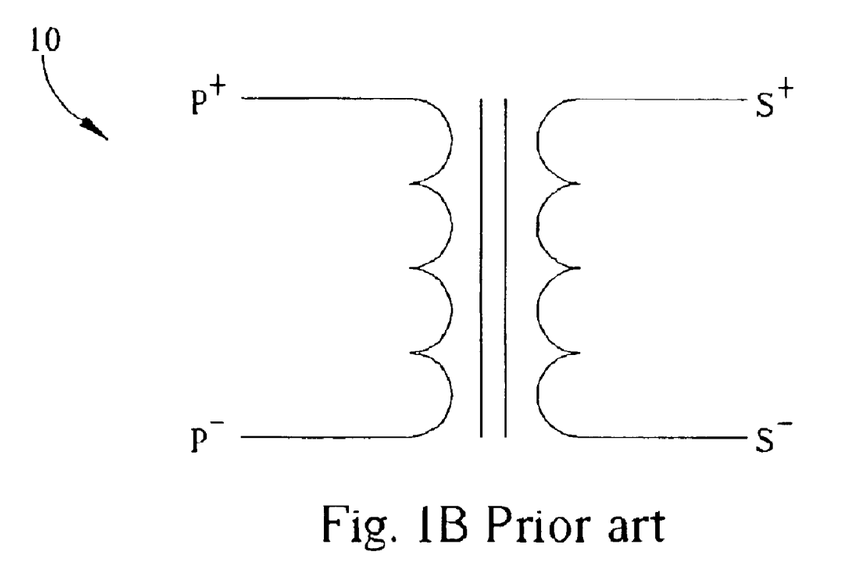
FIG. 1B shows an equivalent circuit diagram of the transformer shown in FIG. 1A
Figure 1C:
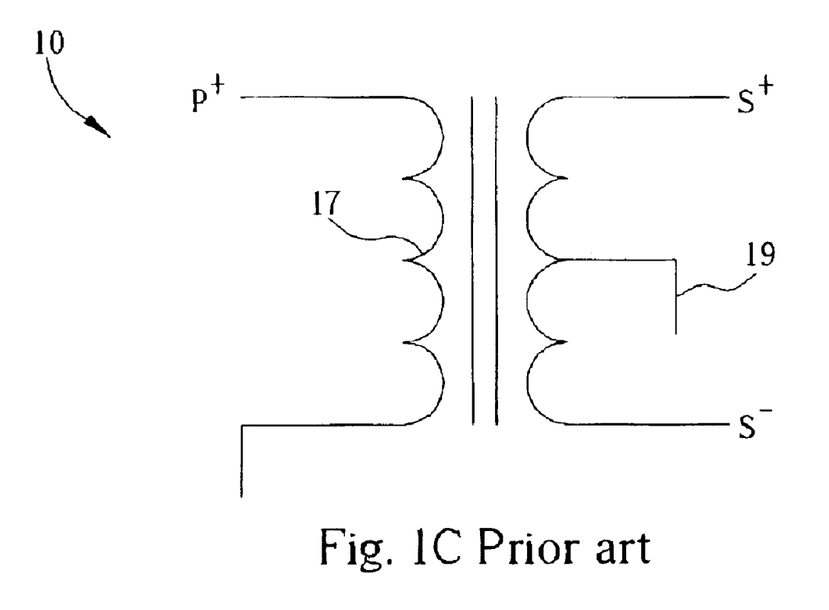
FIG. 1C shows another equivalent circuit diagram of the transformer shown in FIG. 1C FIG. 1D corresponds to a cross section diagram of the transformer shown along a cross plane shown in FIG. 1A.
Figure 1D:
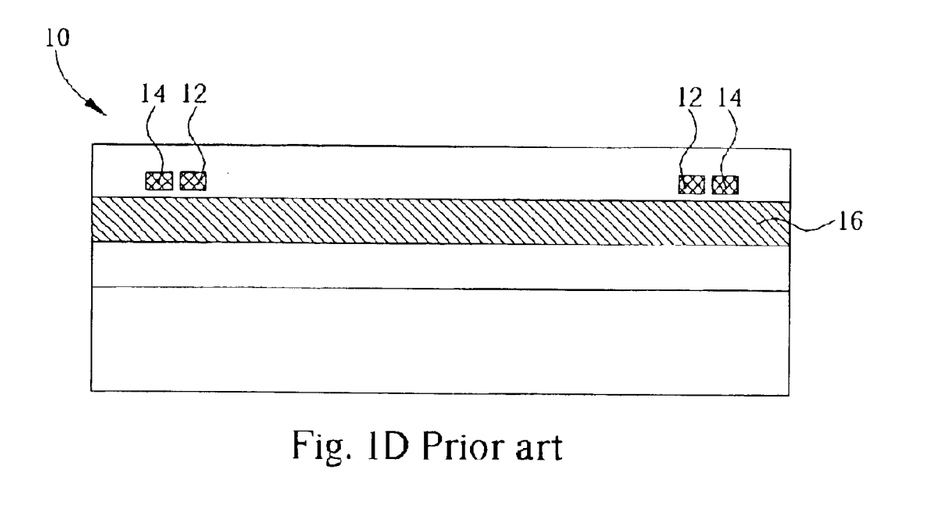

Please refer to FIG. 1A to FIG. 1D. FIG. 1A is a schematic diagram of a BALUN integrated circuit transformer 10 according to the prior art. FIG. 1B and FIG. 1C are equivalent circuit diagrams of the transformer 10 shown in FIG. 1A. FIG. 1B shows an equivalent circuit diagram of the transformer 10 having two pairs of differential-ended signal ends. FIG. 1C shows an equivalent circuit diagram of the transformer 10 having one single-ended signal end and one pair of differential-ended signal ends. FIG. 1D corresponds to a cross section of the transformer 10 along a cross plane 11 shown in FIG. 1A.

The transformer 10 comprises a primary conductive coil 12 and a secondary conductive coil 14, both disposed above an insulating layer 16 (shown in FIG. 1D). The primary conductive coil 12 comprises a pair of differential-ended signal ends $P^+$ and $P^-$. The secondary conductive coil 14 also comprises a pair of differential-ended signal ends $S^+$ and $S^-$.

The primary conductive coil 12 and the secondary conductive coil 14 of the transformer 10 shown in FIG. 1A are interlaced with but not connected to each other. As the secondary conductive coil 14 crosses the primary conductive coil 12 or the primary conductive coil 12 and the secondary conductive coil 14 crosses themselves (as indicated by arrows shown in FIG. 1A), the primary conductive coil 12 or the secondary conductive coil 14 takes a bypass to another insulating layer first through a via plug and then returns to the original layer. Additionally, the primary conductive coil 12 and the secondary conductive coil 14 are symmetrical to a symmetry line 18. That is, both the primary conductive coil 12 and the secondary conductive coil 14 can be divided into two totally identical coils and these two pairs of identical coils are symmetrical to the symmetry line 18. Such a layout for the conductive coils of the transformer 10 can effectively reduce common mode interference. A first single-ended single end 17 of the transformer 10 is located at an intersection of an innermost coil of the primary conductive coil 12 and the symmetry line 18. Likewise, a second single-ended single end 19 of the transformer 10 is located at an intersection of an innermost coil of the secondary conductive coil 14 and the symmetry line 18. An impedance ratio for the pair of differential-ended signal ends $P^+$ and $P^-$ and the pair of differential-ended signal ends $S^+$ and $S^-$ is determined by the number of coils of the primary conductive coil 12 and that of the secondary conductive coil 14.

The above-described single-insulating-layer symmetrical transformer 10 is immune from the common mode interference. However, because the primary conductive coil 12 and the secondary conductive coil 14 are both disposed on the same insulating layer 16, the transformer 10 needs a large area to accommodate the primary conductive coil 12 and the secondary conductive coil 14.

Figure 2A:
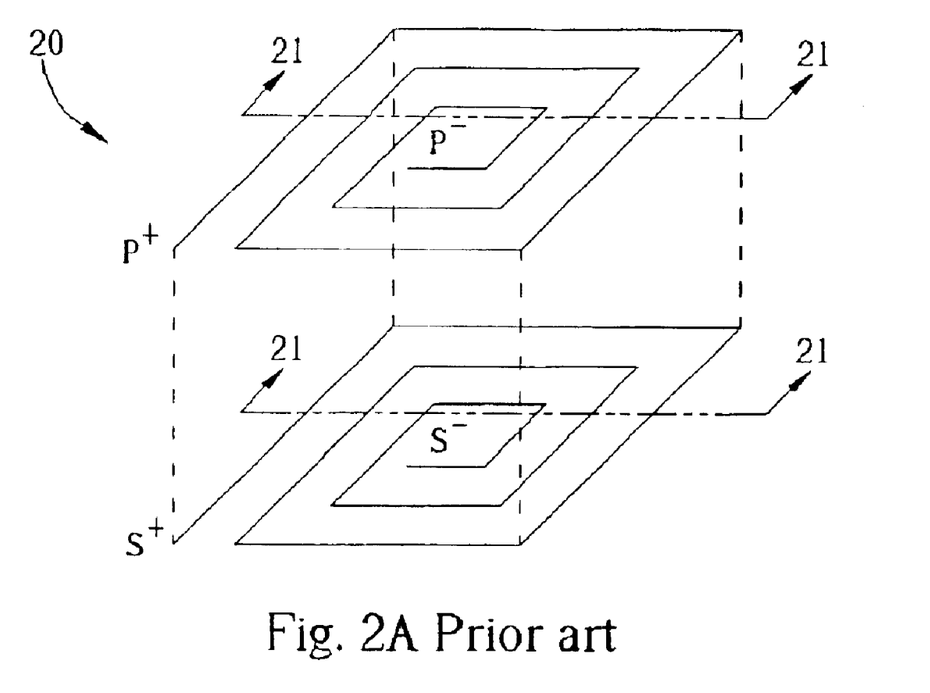
FIG. 2A is a schematic diagram of a double-insulating-layer integrated circuit transformer according to the prior art.
Figure 2B:
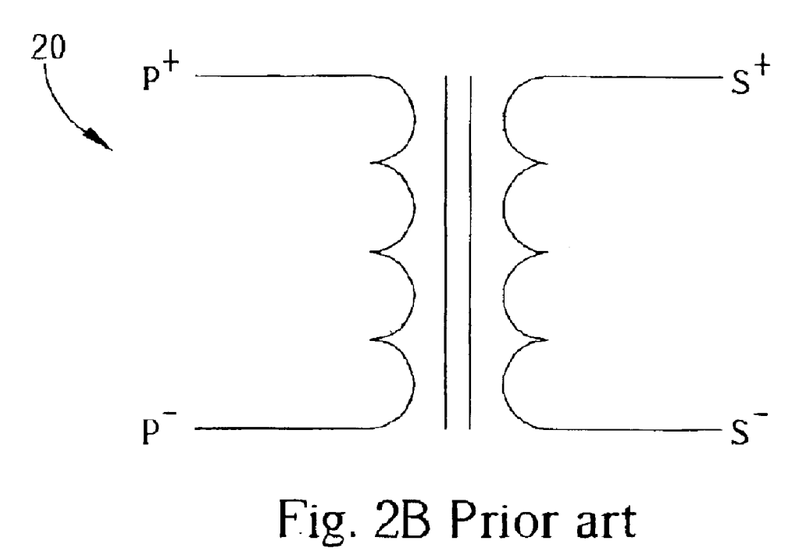
FIG. 2B is an equivalent circuit diagram of the transformer shown in FIG. 2A.
Figure 2C:
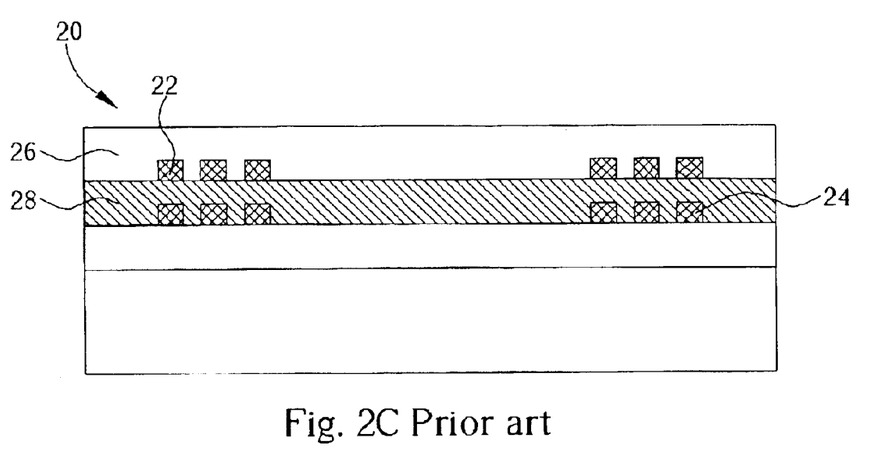
FIG. 2C corresponds to a cross section of the transformer along a cross plane shown in FIG. 2A.

Please refer to FIG. 2A to FIG. 2C. FIG. 2A is a schematic diagram of a dual-layer integrated circuit transformer 20 according to the prior art. FIG. 2B is an equivalent circuit diagram of the transformer 20. FIG. 2C corresponds to a cross section of the transformer 20 along a cross plane 21 shown in FIG. 2A. Note that the transformer 20 does not provide single-ended signals to differential-ended signals transformation. The transformer 20 also comprises a primary conductive coil 22 and a secondary conductive coil 24. The primary conductive coil 22 and the secondary conductive coil 24 respectively comprise a pair of differential-ended signal ends $P^+$, $P^-$ and $S^+$, $S^-$. An impedance ratio for the transformer 20 is determined by the number of coils of the primary conductive coil 22 and that of the secondary conductive coil 24.

Contrary to the transformer 10 shown in FIG. 1A, the transformer 20 comprises two insulating layers. As shown in FIG. 2C, the primary conductive coil 22 is disposed inside a primary insulating layer 26 and the secondary conductive coil 24 is disposed inside a secondary insulating layer 28. Such a disposition of the primary conductive coil 22 and the secondary conductive coil 24 has the advantage to reduce the area of the integrated circuit transformer 20. However, because the primary conductive coil 22 and the secondary conductive coil 24 are lacking symmetry, the transformer 20 is vulnerable to common mode interference.

SUMMARY OF INVENTION

It is therefore a primary object of the claimed invention to provide a double-insulating-layer symmetrical integrated circuit transformer to solve the drawbacks of the prior art integrated circuit transformers.

According to the claimed invention, the multi-layer symmetrical integrated circuit transformer includes a first insulating layer, a first conductive segment formed inside the first insulating layer and disposed on a first side of a first line, and a second conductive segment formed inside the first insulating layer and disposed on a second side of the first line. The second conductive segment and the first conductive segment are symmetrical to the first line. A first end of the first conductive segment and a first end of the second conductive segment are connected to a point located on the first line. The transformer further includes a second insulating layer disposed on the first insulating layer, a third conductive segment formed inside the second insulating layer and disposed on a first side of a second line, and a fourth conductive segment formed inside the second insulating layer. The fourth conductive segment and the third conductive segment are symmetrical to the second line. A first end of the third conductive segment and a first end of the fourth conductive segment are connected to a point located on the second line.

The transformer further comprises a fifth conductive segment formed inside the first insulating layer and disposed on the first side of the first line, a sixth conductive segment formed inside the first insulating layer and disposed on the second side of the first line. The sixth conductive segment and the fifth conductive segment are symmetrical to the first line.

The transformer further includes a first connection conductive segment and a second connection conductive segment. A first end of the first connection conductive segment is connected to an end of the fifth conductive segment and a second end of the first connection conductive segment is connected to a second end of the second conductive segment. A first end of the second connection conductive segment is connected to an end of the sixth conductive segment and a second end of the second connection conductive segment is connected to a second end of the first conductive segment.

It is an advantage of the claimed invention that an integrated circuit transformer having a multi-layer configuration can reduce bulk and cost to designs.

It is another advantage of the claimed invention that an integrated circuit transformer having symmetrical conductive coils can be immune from common mode interference.

These and other objectives of the claimed invention will no doubt become obvious to those of ordinary skill in the art after reading the following detailed description of the preferred embodiment that is illustrated in the various figures and drawings.

DETAILED DESCRIPTION

Figure 3A:
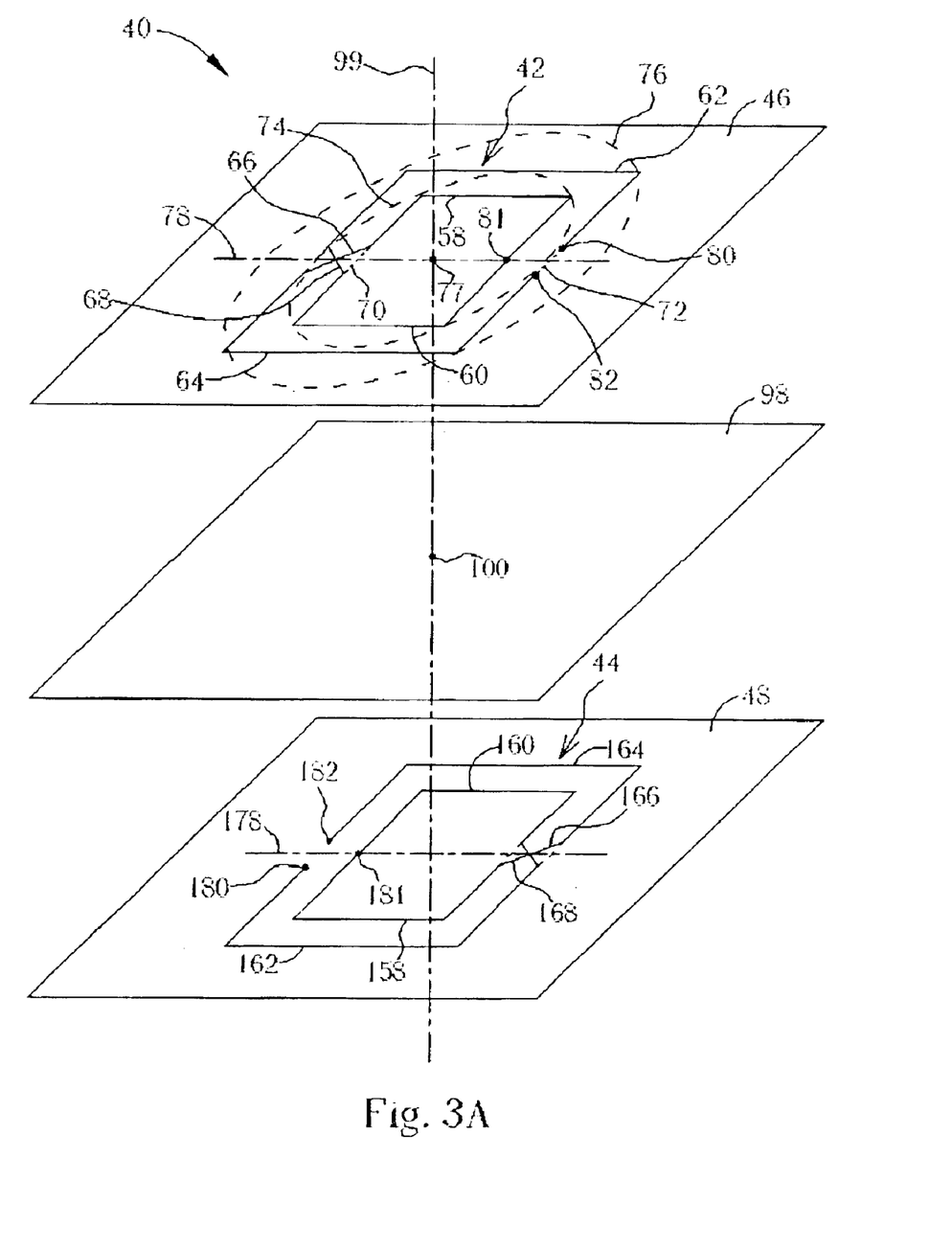
FIG. 3A is a schematic diagram of a multi-layer integrated circuit transformer according to the present invention.
Figure 3B:
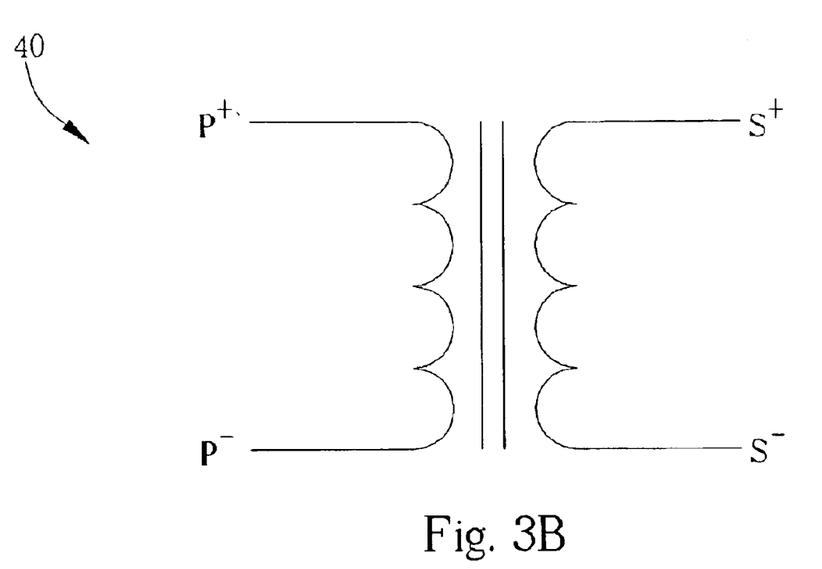
FIG. 3B is an equivalent circuit diagram of the transformer shown in FIG. 3A.
Figure 3C:
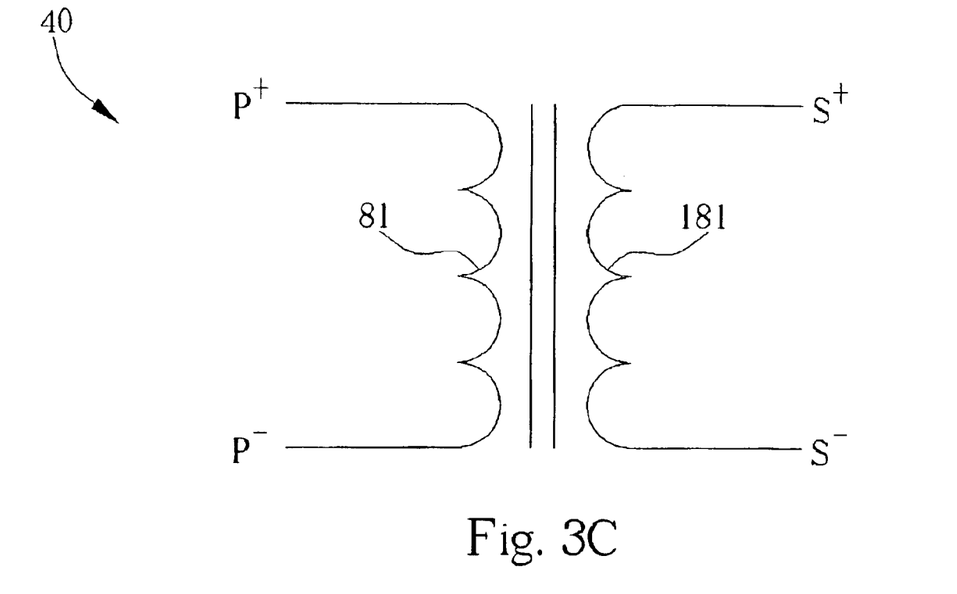
FIG. 3C corresponds to a cross section of the transformer along a cross plane shown in FIG. 3A.

Please refer to FIG. 3, which is a schematic diagram of a multi-layer symmetrical integrated circuit transformer 40 according to the present invention. The transformer 40 comprises a primary conductive coil 42 and a secondary conductive coil 44 respectively disposed inside a primary insulating layer 46 and a secondary insulating layer 48. The primary insulating layer 46 is approximately parallel to the secondary insulating layer 48.

The primary conductive coil 42 of the transformer 40 comprises a first conductive segment 58, a second conductive segment 60, a third conductive segment 62, a fourth conductive segment 64, a first primary connection conductive segment 66, and a second primary connection conductive segment 68. The first conductive segment 58 and the second conductive segment 60 are disposed inside the primary insulating layer 46 along the periphery of a first square 70. The third conductive segment 62 and the fourth conductive segment 64 are also disposed inside the primary insulating layer 46 but along the periphery of a second square 72. (Because the first, the second, the third, and the fourth conductive segment 58, 60, 62 and 64 are respectively disposed on the periphery of the first square 70 and of the second square 72, the first square 70 and the second square 72 still uncovered are indicated with dashed lines shown in FIG. 3A.) The first square 70 and the second square 72 are respectively inscribed on a first circle 74 and on a second circle 76. The first circle 74 and the second circle 76 are concentric circles and have a common center 77. The radius of the first circle 74 and that of the second circle 76 are not equal. The first conductive segment 58 and the third conductive segment 62 are disposed on one side of a primary radius 78. The second conductive segment 60 and the first conductive segment 58 are symmetrical to the primary radius 78. The fourth conductive segment 64 and the third conductive segment 62 are also symmetrical to the primary radius 78. The first conductive segment 58 and the second conductive segment 60 combine to form a first coil disposed inside the primary insulating layer 46. The third conductive segment 62 and the fourth conductive segment 64 combine to form a second coil disposed inside the primary insulating layer 46. The first coil comprises a single-ended signal end 81, which is located on an intersection of the first conductive segment 58 and the second conductive segment 60 and is located on the primary radius 78. The third and the fourth conductive segments 62 and 64 respectively comprise a first primary differential-ended signal end 80 and a second primary differential-ended signal end 82. The first primary differential-ended signal end 80 and the second primary differential-ended signal end 82 are symmetrical to the primary radius 78. The first primary connection conductive segment 66 connects the first conductive segment 58 and the fourth conductive segment 64. The second primary connection conductive segment 68 connects the second conductive segment 60 and the third conductive segment 62. The first primary connection conductive segment 66 does not intersect the second primary connection segment 68. The detailed layout of the first and the second primary connection conductive segment 66 and 68 will be described later.

The secondary conductive coil 44 comprises a plurality of conductive segments corresponding to the first 58 to the fourth conductive segment 64 of the primary conductive coil 42. The layout of the conductive segments disposed inside the secondary insulating layer 48 is described as follows: The secondary conductive coil 44 of the transformer 40 also comprises a first conductive segment 158, a second conductive segment 160, a third conductive segment 162 and a fourth conductive segment 164. The first conductive segment 158 of the secondary conductive coil 44 and the first conductive segment 58 of the primary conductive coil 42 is symmetrical to an intersection 100 of a line 99 passing the common center 76 and perpendicular to the primary radius 78 and a mid-plane 98 of the primary insulating layer 46 and the secondary insulating layer 48. Likewise, the second conductive segment 160 of the secondary conductive coil 44 and the second conductive segment 60 of the primary conductive coil 42, the third conductive segment 162 of the secondary conductive coil 44 and the third conductive segment 62 of the primary conductive coil 42, and the fourth conductive segment 164 of the secondary conductive coil 44 and the fourth conductive segment 64 of the primary conductive coil 42 are respectively symmetrical to the intersection 100. Therefore, the first conductive segment 158 and the second conductive segment 160 are symmetrical to a secondary radius 178. The secondary radius 178 and the primary radius 78 are symmetrical to the intersection 100. The third conductive segment 162 and the fourth conductive segment 164 are also symmetrical to the secondary radius 178. The third conductive segment 162 and the fourth conductive segment 164 respectively comprise a first secondary differential-ended signal end 180 and a second secondary differential-ended signal end 182. Of course, the first secondary differential-ended signal end 180 and the second secondary differential-ended signal end 182 are symmetrical to the secondary radius 178. A first coil (includes the first conductive segment 158 and the second conductive segment 160) disposed inside the secondary insulating layer 48 of the transformer 40 comprises a single-ended signal end 181, which is an intersection of the first conductive segment 158 and the second conductive segment 160 and is disposed on the secondary radius 178. The secondary conductive coil 44 further comprises a first secondary connection conductive segment 166 and a second secondary connection conductive segment 168. The first secondary connection conductive segment 166 connects the first conductive segment 158 and the fourth conductive segment 164. The second secondary connection conductive segment 168 connects the second conductive segment 160 and the third conductive segment 162. The first secondary connection conductive segment 166 does not intersect the second secondary connection conductive segment 168.

Since the first primary connection conductive segment 66 cannot intersect the second primary connection conductive segment 68 and the first secondary connection conductive segment 166 cannot intersect the second secondary connection conductive segment 168 either, when the first primary connection conductive segment 66 is about to intersect the second primary connection conductive segment 68 or the first secondary connection conductive segment 166 is about to intersect the second secondary connection conductive segment 168, the first primary connection conductive segment 66 (or the second primary connection conductive segment 68) and the second secondary connection conductive segment 168 (or the first secondary connection conductive segment 166) have to bypass to the other insulating layer.

Figure 4A:
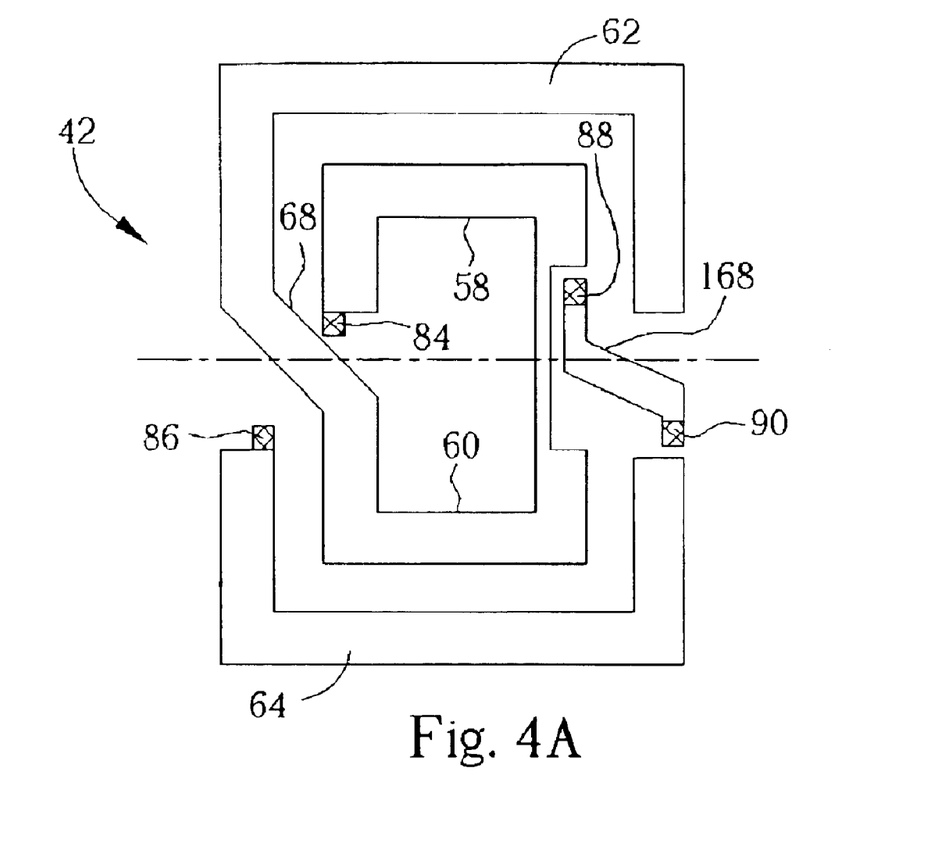
FIG. 4A is a layout of the primary conductive coil of the transformer shown in FIG. 3A.
Figure 4B:
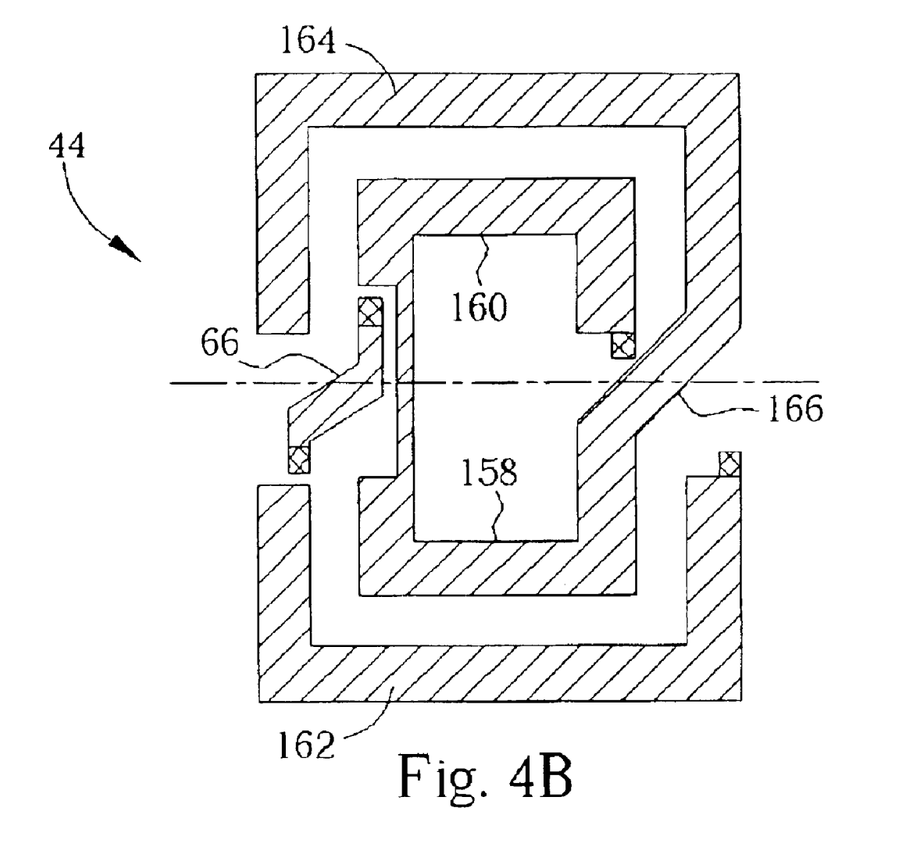
FIG. 4B is a layout of the secondary conductive coil of the transformer shown in FIG. 3A.

The layout of the four connection conductive segments 66, 68, 166, and 168 is described as follows: Please refer to FIG. 4A and FIG. 4B. FIG. 4A shows the layout of the primary conductive coil 42 disposed inside the primary insulating layer 46. FIG. 4B shows the layout of the secondary conductive coil 44 disposed inside the secondary insulating layer 48. The second primary connection conductive segment 68 of the primary conductive coil 42 is disposed inside the primary insulating layer 46. The first primary connection conductive segment 66 of the primary conductive coil 42 is disposed inside the secondary insulating layer 48. The first primary connection conductive segment 66 connects the first conductive segment 58 and the fourth conductive segment 64 through two via plugs 84, 86, which are formed on the primary insulating layer 46. The layout of the secondary conductive coil 44 is similar to that of the primary conductive coil 42. The first secondary connection conductive segment 166 of the secondary conductive coil 44 is disposed inside the secondary insulating layer 48. The second secondary connection conductive segment 168 of the secondary conductive coil 44 is disposed inside the primary insulating layer 46. The second secondary connection conductive segment 168 connects the second conductive segment 160 and the third conductive segment 162 through another two via plugs 88, 90, which are formed on the primary insulating layer 46.

The layouts of the first and second primary connection conductive segment 66, 68 and the first and second secondary connection conductive segment 166, 168 respectively shown in FIG. 4A and FIG. 4B are a preferred embodiment of the present invention. That is, other layouts of the connection conductive segments 66, 68, 166 and 168 are also possible in relation to the present invention as long as the first primary connection conductive segment 66 connects the first conductive segment 58 and the fourth conductive segment 64, the second primary connection conductive segment 68 connects the second conductive segment 60 and the third conductive segment 62, the first secondary connection conductive segment 166 connects the first conductive segment 158 and the fourth conductive segment 164, and the second secondary connection conductive segment 168 connects the second conductive segment 160 and the third conductive segment 162. Additionally, both the number of coils of the primary conductive coil 42 and that of the secondary conductive coil 44 are two, so the impedance ratio of the transformer 40 is one. Adjusting the number of coils of the primary conductive coil 42 or that of the secondary conductive coil 44 will change the impedance ratio of the transformer 40.

Figure 5:
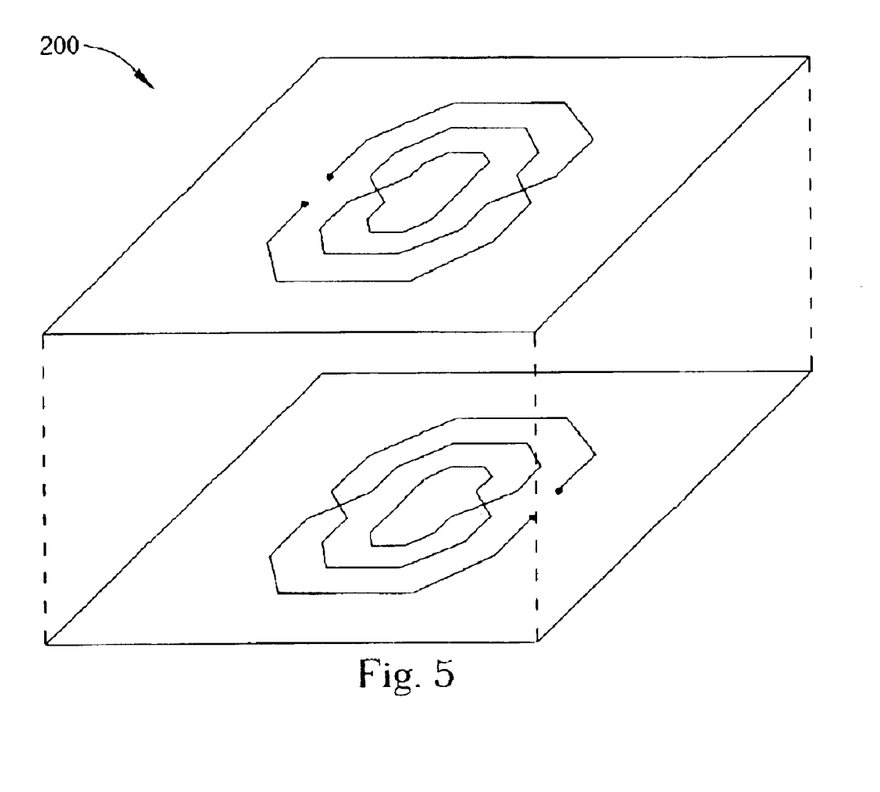
FIG. 5 is a schematic diagram of a second embodiment of the present invention.

Although all the conductive segments of the transformer 40 shown in FIG. 3A are disposed inside an insulating layer along a peripheral of a square, the conductive segments of the transformer 40 can be disposed inside an insulating layer along a peripheral of a hexagon, of an octagon, or even of a circle (having an infinite number of edges). Please refer to FIG. 5, which is a schematic diagram of a second integrated circuit transformer 200 according to the present invention. The differences between the transformer 200 and the transformer 40 shown in FIG. 3A are all the conductive segments of the transformer 200 are disposed inside insulating layers along a peripheral of an octagon and each conductive coil disposed inside each insulating layer of the transformer 200 comprises three coils of conductive segments. Since the layout and the symmetrical characteristic of the conductive segments of the transformer 200 are the same as those of the conductive segments of the transformer 40, further description of the transformer 200 is omitted.

Figure 6:
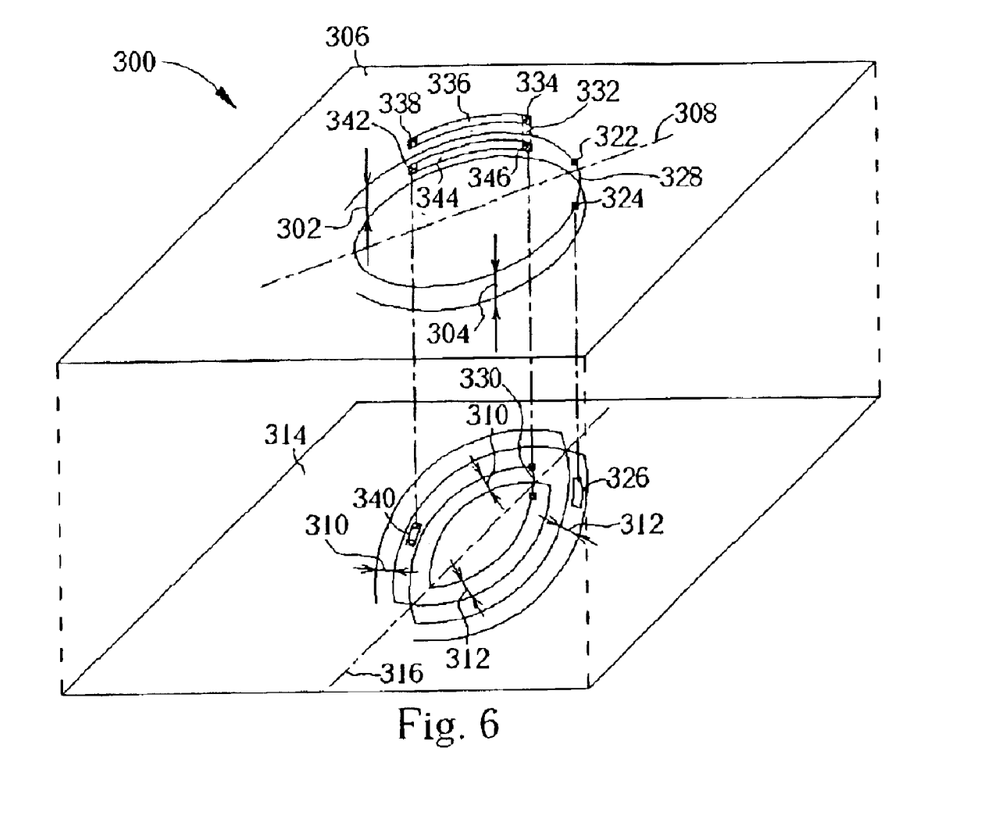
FIG. 6 is a schematic diagram of a third embodiment of the present invention.

The above-mentioned transformers 40 and 200 are strictly symmetrical, which means that the conductive segments of the transformers 40 and 200 are respectively symmetrical to the primary radius 78, the secondary radius 178 and the intersection 100. However, the transformers 40 and 200 may be loosely symmetrical. For example, referring to FIG. 6, an integrated circuit transformer 300 comprises a first conductive segment 302 and a second conductive segment 304, both disposed inside a primary insulating layer 306 and symmetrical to a primary line 308. The transformer 300 further comprises a third conductive segment 310 and a fourth conductive segment 312, both disposed inside a secondary insulating layer 314 and symmetrical to a secondary line 316. The secondary insulating layer 314 is not necessarily parallel to the primary insulating layer 306. The secondary line 316 is not necessarily parallel or symmetrical to the primary line 308. And the conductive segments disposed inside the primary insulating layer 306 are also not necessarily symmetrical to the conductive segments disposed inside the secondary insulating layer 314.

While the conductive segments disposed inside the primary insulating layer 306 are not necessarily symmetrical to the conductive segments disposed inside the second insulating layer 314, any conductive segment of the transformer 300 is prohibited from intersecting the remaining conductive segments, no matter what insulating layer the remaining conductive segments are disposed inside. Referring to FIG. 6 again, for example, a first secondary conductive segment 326 is a projection of a first primary conductive segment 328, which is an intersection conductive segment of the first conductive segment 302 and the second conductive segment 304, onto the secondary insulating layer 314. Because the first secondary conductive segment 326 is disposed between two neighboring conductive segments of the fourth conductive segment 312, the first secondary conductive segment 326 can connect the first conductive segment 302 and the second conductive segment 304 with only a first via plug 322 and a second via plug 324, both are formed on the primary insulating layer 306. Note that the first secondary conductive segment 326 does not intersect any conductive segments disposed inside the secondary insulating layer 314. For another example, a second primary conductive segment 332 (indicated by dashed lines) is a projection of a second secondary conductive segment 330, which is an intersection conductive segment of the third conductive segment 310 and the fourth conductive segment 312, onto the primary insulating layer 306. Because the second primary conductive segment 332 intersects the first conductive segment 302, the third conductive segment 310 has to take a detour of a third via plug 334, a third primary conductive segment 336, a fourth via plug 338, a third secondary conductive segment 340, a fifth via plug 342, a fourth primary conductive segment 344 and a six via plug 346 to connect with the fourth conductive segment 312. Of course, the above lengthy and complicated layout can be avoided by slightly changing the traces of corresponding conductive segments.

In contrast to the prior art single-layer symmetrical integrated circuit transformer or the prior art double-layer non-symmetrical integrated circuit transformer, the present invention can provide an integrated circuit transformer having symmetrical conductive segments respectively disposed inside two insulating layers. The claimed invention has at least following advantages:

1) The claimed invention provides a double-layer transformer, reducing bulk and cost to designs;
2) The conductive coils of the claimed invention are symmetrical and are immune from common mode interference;
3) The primary conductive coil and the secondary conductive coil are respectively disposed inside two closed-disposition insulating layers, adding mutual inductance of the transformer; and
4) Because the primary conductive coil and the secondary conductive coil are respectively disposed inside two separate insulating layers, each conductive coil can have wide conductive segments, reducing resistance of the primary conductive coil and the secondary conductive coil and reducing power consumption of the transformer caused by the resistance of the conductive coils.

In summary, the claimed invention provides an integrated circuit transformer with a high quality factor but a bulk of chip size.

Following the detailed description of the present invention above, those skilled in the art will readily observe that numerous modifications and alterations of the device may be made while retaining the teachings of the invention. Accordingly, the above disclosure should be construed as limited only by the metes and bounds of the appended claims.

What is claimed is:

1. An integrated circuit transformer comprising:
   a first insulating layer;
   a first conductive segment formed inside the first insulating layer and disposed on a first side of a first lines;
   a second conductive segment formed inside the first insulating layer and disposed on a second side of the first line, the second conductive segment and the first conductive segment being symmetrical to the first line, a first end of the first conductive segment and a first end of the second conductive segment being connected to a point located on the first line;
   a second insulating layer disposed on the first insulating layer;
   a third conductive segment formed inside the second insulating layer and disposed on a first side of a second line, the second line being not parallel to the first line; and
   a fourth conductive segment formed inside the second insulating layer, the fourth conductive segment and the third conductive segment being symmetrical to the second line, a first end of the third conductive segment and a first end of the fourth conductive segment being connected to a point located on the second line.

2. The integrated circuit transformer of claim 1 wherein the conductive segments formed inside the first insulating layer are not symmetrical with the conductive segments formed inside the second insulating layer.

3. The integrated circuit transformer of claim 1 wherein the first line and the second line are substantially straight.

4. The integrated circuit transformer of claim 1 wherein the first insulating layer is not parallel with the second insulating layer.

5. An integrated circuit transformer comprising:
   a plurality of layers of transformer coils comprising primary coils and secondary coils, said primary coils being symmetrical relative to a first straight line and said secondary coils being symmetrical relative to a second straight line and nonsymmetrical relative to said primary coils;
   a plurality of insulating layers for isolating the plurality of layers of transformer coils; and
   a plurality of via plugs for connecting transform coils disposed on different insulating layers.

6. The integrated circuit transformer of claim 5 comprising two layers of transformer coils.

7. The integrated circuit transformer of claim 6 wherein said two layers of transform coils are not parallel with each other.

8. The integrated circuit transformer of claim 5 wherein said first straight line is not parallel with said second straight line.

9. The integrated circuit transformer of claim 5 wherein the via plugs will change from one layer to another layer only when the transformer coils are crossed to each other, so that the primary coils and the secondary coils respectively have symmetrical structures.

* * * * *